(12) United States Patent  
Inokuchi et al.

(10) Patent No.: US 9,515,061 B2  
(45) Date of Patent: Dec. 6, 2016

(54) SEMICONDUCTOR MODULE AND SEMICONDUCTOR DEVICE

(71) Applicant: Mitsubishi Electric Corporation, Tokyo (JP)

(72) Inventors: Seiichiro Inokuchi, Tokyo (JP); Arata Iizuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/876,230

(22) Filed: Oct. 6, 2015

(65) Prior Publication Data

US 2016/0181232 A1 Jun. 23, 2016

(30) Foreign Application Priority Data

Dec. 18, 2014 (JP) ................ 2014-255828

(51) Int. Cl.
*H01L 29/15* (2006.01)
*H01L 25/18* (2006.01)
*H01L 23/367* (2006.01)
*H01L 23/538* (2006.01)
*H01L 29/861* (2006.01)
*H01L 23/04* (2006.01)
*H01L 23/492* (2006.01)
*H01L 23/24* (2006.01)
*H01L 23/36* (2006.01)
*H01L 23/373* (2006.01)
*H01L 23/498* (2006.01)

(52) U.S. Cl.
CPC .............. *H01L 25/18* (2013.01); *H01L 23/04* (2013.01); *H01L 23/24* (2013.01); *H01L 23/36* (2013.01); *H01L 23/3675* (2013.01); *H01L 23/3735* (2013.01); *H01L 23/492* (2013.01); *H01L 23/49811* (2013.01); *H01L 23/5386* (2013.01); *H01L 29/861* (2013.01); *H01L 2924/0002* (2013.01)

(58) Field of Classification Search
CPC ... H01L 23/04; H01L 23/24; H01L 23/3675; H01L 23/5386
See application file for complete search history.

(56) References Cited

U.S. PATENT DOCUMENTS 8,921,998 B2 12/2014 Zushi et al.

FOREIGN PATENT DOCUMENTS

JP 2013-045974 A 3/2013

*Primary Examiner* — Douglas Menz
(74) *Attorney, Agent, or Firm* — Studebaker & Brackett PC

(57) ABSTRACT

A semiconductor module includes first and second semiconductor elements connected in series, an insulating substrate, first and second metal patterns formed on a first main surface and a second main surface of the insulating substrate, and first, second, and third electrode plates. A lower surface electrode and an upper surface electrode of the first semiconductor element are bonded to the first metal pattern and the first electrode plate, respectively. The first metal pattern and the third electrode plate are bonded together. An upper surface electrode of the second semiconductor element is bonded to the third electrode plate. A lower surface electrode of the second semiconductor element is electrically connected to the second metal pattern. The second metal pattern and the second electrode plate are bonded together. One end of the first electrode plate and one end of the second electrode plate are led out on the same side.

8 Claims, 5 Drawing Sheets

300

US 9,515,061 B2

SEMICONDUCTOR MODULE AND SEMICONDUCTOR DEVICE

FIELD OF THE INVENTION

The present invention relates to a semiconductor module and a semiconductor device. For example, the present invention relates to a semiconductor module for electric power use that handles a large current.

DESCRIPTION OF THE BACKGROUND ART

In recent years, there has been a trend toward larger-capacity semiconductor modules for electric power use. A large-capacity semiconductor module has increased parasitic inductance because of its long wiring length. The operation of the semiconductor module at a high switching speed with a low switching loss results in an increase in surge voltage. Therefore, there has been a demand for low-inductance semiconductor modules. According to the Japanese Patent Application Laid-Open No. 2013-45974, one insulating substrate is overlaid on another insulating substrate to provide the parallel current paths, thereby reducing inductance.

In general, for the working of the semiconductor module for power use, the P electrode and the N electrode are desirably led out from the package in the same direction. According to the Japanese Patent Application Laid-Open No. 2013-45974, the N side (GND) is located immediately above the heat sink such that the P electrode and the N electrode are aligned. The wiring of the upper arm and the AC electrode being at the same potential include a plurality of components. Similarly, the wiring of the lower arm and the N electrode being at the same potential include a plurality of components.

Along with an increase in the number of components of the semiconductor module, the number of manufacturing process increases, deteriorating the assembly performance. In particular, the technique has been unfortunately unsuitable for application to a large-capacity product including a plurality of parallel arrangements of semiconductor elements. In addition, the double-layer structure of insulating substrates has deteriorated the heat dispersion properties.

SUMMARY OF THE INVENTION

An object of the present invention is to provide a semiconductor module and a semiconductor device having low inductance as well as improved assembly performance and improved heat dispersion properties.

A semiconductor module according to the present invention includes a first semiconductor element and a second semiconductor conductor element connected in series, an insulating substrate, a first metal pattern formed on a first main surface of the insulating substrate, a second metal pattern formed on a second main surface side of the insulating substrate, a first electrode plate, a second electrode plate, and a third electrode plate. The first and second semiconductor elements each include an upper surface electrode and a lower surface electrode. The lower surface electrode of the first semiconductor element is bonded to the first metal pattern. The upper surface electrode of the first semiconductor element is bonded to the first electrode plate. The first metal pattern and the third electrode plate are bonded to each other. The upper surface electrode of the second semiconductor element is bonded to the third electrode plate. The lower surface electrode of the second semiconductor element is electrically connected to the second metal pattern. The second metal pattern and the second electrode plate are bonded to each other. One end of the first electrode plate and one end of the second electrode plate are led out on the same side.

In the semiconductor module according to the present invention, the wiring of the AC electrode and the wiring of the N electrode can be formed as the single third electrode plate and the single first electrode plate, respectively. Consequently, the wiring of the AC electrode and the wiring of the N electrode can be shortened and simplified. This reduces the number of components of the semiconductor module. The first and third electrode plates are directly bonded to the semiconductor elements without a member such as a wire located therebetween, so that the throughput of the manufacturing process can be improved. Unlike the wiring by wire bonding, this approach contributes to the improvement of assembly performance. The wiring formed of the first, second, and third electrode plates reduces the wiring resistance, being little affected by heating caused by Joule heat. In addition, it is expected that the first, second, and third electrode plates dissipate heat. This contributes to the reduced thermal resistance. The first electrode plate and the second metal pattern that is in connection with the second electrode plate are wired in parallel with each other. This can further reduce the inductance between the P electrode and the N electrode.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
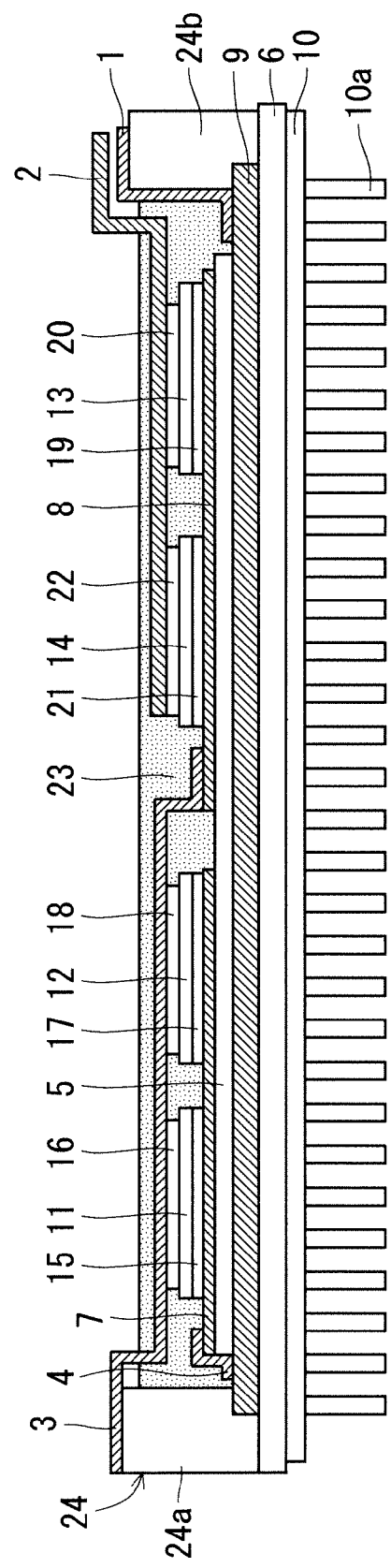
FIG. 1 is a cross-sectional view of a semiconductor module according to a first preferred embodiment.
Figure 2:
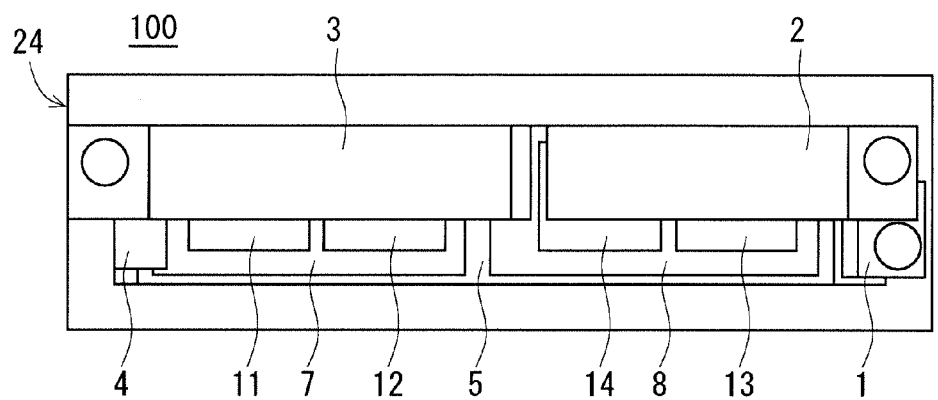
FIG. 2 is a plan view of the semiconductor module according to the first preferred embodiment.
Figure 3:
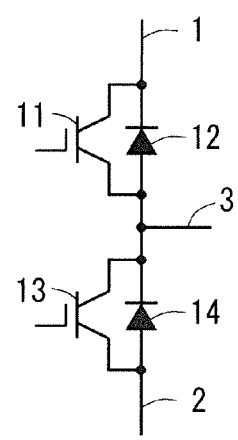
FIG. 3 is a connecting diagram of the semiconductor module according to the first preferred embodiment.

FIGS. 1 and 2 are a cross-sectional view and a plan view of a semiconductor module 100 according to a first preferred embodiment. FIG. 3 is a connecting diagram of the semiconductor module 100.

As shown in FIG. 1, the semiconductor module 100 includes first and second semiconductor elements 13 and 11 serving as switching elements, an insulating substrate (a first ceramic substrate 5), a first metal pattern 8 formed on a first main surface (upper surface) of the insulating substrate (the first ceramic substrate 5), and a second metal pattern 9 formed on a second main surface (lower surface) of the insulating substrate (the first ceramic substrate 5).

The semiconductor module 100 further includes a first electrode plate 2 corresponding to the N electrode, a second electrode plate 1 corresponding to the P electrode, and a third electrode plate 3 corresponding to the AC electrode.

The semiconductor module 100 further includes a third metal pattern 7 formed on the first main surface of the insulating substrate (the first ceramic substrate 5) separately from the first metal pattern 8.

The semiconductor module 100 further includes a second ceramic substrate 6 and a heat sink 10 located on the back surface of the second ceramic substrate 6. The heat sink 10 includes a plurality of fins 10a.

The semiconductor module 100 further includes a first freewheeling diode 14 connected in parallel with the first semiconductor element 13 and a second freewheeling diode 12 connected in parallel with the second semiconductor element 11.

The first and third metal patterns 7 and 8 are formed on the upper surface of the first ceramic substrate 5. The second metal pattern 9 is formed on the upper surface the second ceramic substrate 6. The heat sink 10 is located on the lower surface of the second ceramic substrate 6.

In the first preferred embodiment, for example, each of the first semiconductor element 13 and the second semiconductor element 11 is an insulated gate bipolar transistor (IGBT). Each of the first and second semiconductor elements 13 and 11 is, for example, a wide bandgap semiconductor element (such as a silicon carbide (SiC) semiconductor element and a gallium nitride (GaN) semiconductor element). The first and second semiconductor elements 13 and 11 each include an upper surface electrode and a lower surface electrode being the main electrodes. The first and second freewheeling diodes 14 and 12 each include an upper surface electrode and a lower surface electrode.

As shown in FIG. 1, the lower surface electrode of the first semiconductor element 13 and the lower surface electrode of the first freewheeling diode 14 are bonded to the first metal pattern 8 through solder 19 and solder 21, respectively. The upper surface electrode of the first semiconductor element 13 and the upper surface electrode of the first freewheeling diode 14 are bonded to the first electrode plate 2 through solder 20 and solder 22, respectively.

The first metal pattern 8 and the third electrode plate 3 are bonded together through, for example, solder. The upper surface electrode of the second semiconductor element 11 and the upper surface electrode of the second freewheeling diode 12 are bonded to the third electrode plate 3 through solder 16 and solder 18, respectively.

The lower surface electrode of the second semiconductor element 11 and the lower surface electrode of the second freewheeling diode 12 are bonded to the third metal pattern 7 through solder 15 and solder 17, respectively.

The third metal pattern 7 and the second metal pattern 9 are electrically connected to each other through a metal member 4 having a plate shape. The second metal pattern 9 and the second electrode plate 1 are bonded together through, for example, solder.

One end of the first electrode plate 2 and one end of the second electrode plate 1 are led out on the same side of the case (a case 24b). One end of the third electrode plate 3 is led out on a case 24a.

The electrode plates and the metal patterns (such as the second electrode 1 and the third metal pattern 7) are not necessarily bonded to each other by soldering and may be, for example, directly bonded together by ultrasonic waves.

Similarly, the electrodes of the semiconductor elements and the electrodes of the freewheeling diodes are bonded to the metal patterns or the electrode plates by soldering. Alternatively, for example, they may be directly bonded together by ultrasonic waves.

As shown in FIGS. 1 and 2, the semiconductor module 100 according to the first preferred embodiment has the "2 in 1" structure in which an upper-arm semiconductor element and a lower-arm semiconductor element are included in a case. The first electrode plate 3 serving as the AC electrode and the first metal pattern 8 are at the same potential. The first electrode plate 2 serving as the N electrode and the GND are at the same potential. The second electrode plate 1 serving as the P electrode, the second metal pattern 9, the metal member 4, and the third metal pattern 7 are at the same potential.

A case 24 houses: the first and second semiconductor elements 13 and 11; the first and second freewheeling diodes 14 and 12; the first, second, and third electrode plates 2, 1, and 3; and the first, second, and third metal patterns 8, 9, and 7. The inside of the case 24 is sealed with gel 23. The gel 23 may be resin.

Figure 4:
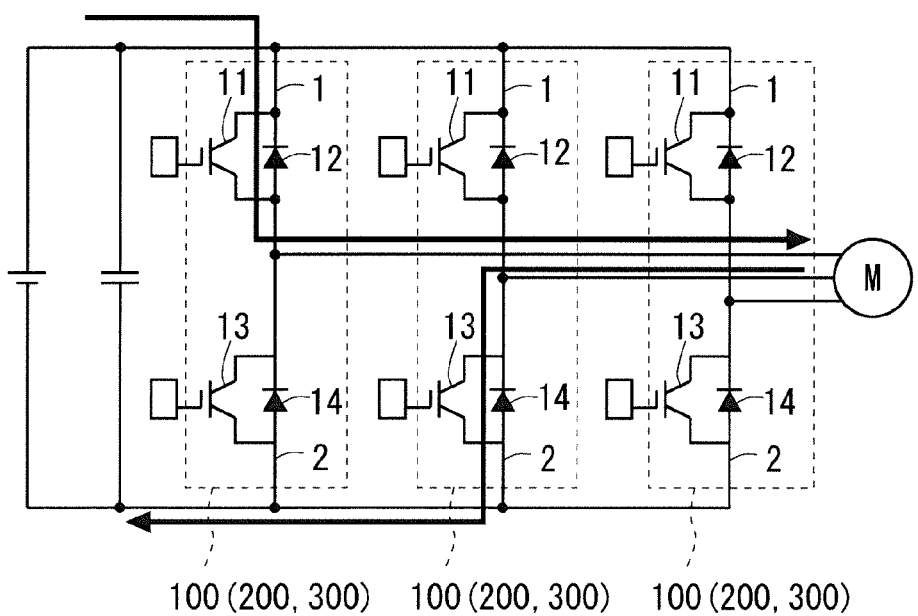
FIG. 4 is a connecting diagram of the semiconductor device according to the first preferred embodiment.

FIG. 4 is a connecting diagram of the semiconductor device according to the first preferred embodiment. The semiconductor device according to the first preferred embodiment has a configuration in which three semiconductor modules 100 are housed in the case. For example, the semiconductor device having the "6 in 1" structure as shown in FIG. 4 can be used to drive the three-phase motor.

<Effects>

The semiconductor module 100 according to the first preferred embodiment includes the first and second semiconductor elements 13 and 11 connected in series, the insulating substrate (the first ceramic substrate 5), the first metal pattern 8 formed on the first main surface of the insulating substrate, the second metal pattern 9 formed on the second main surface side of the insulating substrate, the first electrode plate 2, the second electrode plate 1, and the third electrode plate 3. The first and second semiconductor elements 13 and 11 each include an upper surface electrode and a lower surface electrode. The lower surface electrode of the first semiconductor element 13 is bonded to the first metal pattern 8. The upper electrode of the first semiconductor element 13 is bonded to the first electrode plate 2. The first metal pattern 8 and the third electrode plate 3 are bonded together. The upper surface electrode of the second semiconductor element 11 is bonded to the third electrode plate 3. The lower surface electrode of the second semiconductor element 11 is electrically connected to the second metal pattern 9. The second metal pattern 9 and the second electrode plate 1 are bonded together. One end of the first electrode plate 2 and one end of the second electrode plate 1 are led out on the same side.

As shown in FIG. 1, in the semiconductor module 100 according to the first preferred embodiment, the P electrode is wired on the second metal pattern 9 on the second main surface of the first ceramic substrate 5, so that the wiring of the AC electrode and the wiring of the N electrodes can be formed as the single third electrode plate 3 and the single first electrode plate 2, respectively. Consequently, the wiring of the AC electrode and the wiring of the N electrode can be shortened and simplified. This reduces the number of components of the semiconductor module 100.

The first and third electrode plates 2 and 3 are directly bonded to the semiconductor elements without a member such as a wire located therebetween, so that the throughput of the manufacturing process can be improved. Unlike the wiring by wire bonding, this approach contributes to the improvement of assembly performance.

In general, the wiring through wire connection is disadvantageous in that the increased interconnection resistance evolves Joule heat, causing heating of the wiring. In the first preferred embodiment, the wiring formed of the first, second, and third electrode plates 2, 1, and 3 reduces the wiring resistance, being little affected by heating caused by Joule heat. In addition, it is expected that the first, second, and third electrode plates 2, 1, and 3 dissipate heat. This contributes to the reduced thermal resistance, which has been a challenge.

In the first preferred embodiment, the first electrode plate 2 and the second metal pattern 9 that is in connection with the second electrode plate 1 are wired in parallel with each other. This can further reduce the inductance between the P electrode and the N electrode.

The use of the P electrode having a large wiring length extends the overall current path between the P electrode and the N electrode. In the first preferred embodiment, the electrode is wired as the electrode plate, thereby reducing Joule heat and the inductance between the remaining electrodes.

The structure above including the third electrode plate 3 as the AC electrode and the first electrode plate 2 as the N electrode facilitates the wiring work in the manufacturing process. This structure is therefore capable of readily providing a large-capacity module with chips connected in parallel. This structure, which reduces thermal resistance, size, and induction and improves assembly performance, is best suited to the module to be subjected to a large current.

The semiconductor module 100 according to the first preferred embodiment further includes the third metal pattern 7 formed on the first main surface of the insulating substrate (the first ceramic substrate 5) separately from the first metal pattern 8. The lower surface electrode of the second semiconductor element 11 is bonded to the third metal pattern 7, so that the third metal pattern 7 and the second metal pattern 9 are electrically connected to each other.

The third metal pattern 7 is located on the first main surface of the first ceramic substrate 5, so that the third metal pattern 7 is bonded to the lower electrode of the second semiconductor element 11 and the third metal pattern 7 is electrically connected to the second metal pattern 9. This configuration allows the lower surface electrode of the second semiconductor element 11 and the second metal pattern 9 to be electrically connected to each other.

The semiconductor module 100 according to the first preferred embodiment further includes the first freewheeling diode 14 connected in parallel with the first semiconductor element 13 serving as a switching element and the second freewheeling diode 12 connected in parallel with the second semiconductor element 11 serving as a switching element. The first and second freewheeling diodes 14 and 12 each include an upper surface electrode and a lower surface electrode. The lower surface electrode of the first freewheeling diode 14 is bonded to the first metal pattern 8. The upper surface electrode of the first freewheeling diode 14 is bonded to the first electrode plate 2. The upper surface electrode of the second freewheeling diode 12 is bonded to the third electrode plate 3. The lower surface electrode of the second freewheeling diode 12 is electrically connected with the second metal pattern 9.

Thus, the first and second semiconductor elements 13 and 11 being, for example, IGBTs are protected from a surge current in the semiconductor module 100 including the freewheeling diodes connected in parallel with the respective IGBTs.

The semiconductor device according to the first preferred embodiment includes the plurality of semiconductor modules 100 and the case. The case houses the plurality of semiconductor modules 100 connected in parallel.

For example, the "6 in 1" structure in which three semiconductor modules 100 in parallel are housed in the case provides the inverter for driving the three-phase motor. The plurality of semiconductor modules 100 are housed in the case, so that the semiconductor device can be reduced in size and the productivity can be improved.

The semiconductor module 100 according to the first preferred embodiment further includes the heat sink 10 held below the surface of the second metal pattern 9 opposite to the insulating substrate (the first ceramic substrate 5) with the insulating material (the second ceramic substrate 6) located therebetween.

The semiconductor modules 100 including the heat sink 10 combined therewith has further improved heat dispersion properties.

The first and second semiconductor elements 13 and 11 of the semiconductor module 100 according to the first preferred embodiment are wide bandgap semiconductor elements.

The wide bandgap semiconductors made of, for example, SiC and GaN, which are driven at a high carrier frequency on the application, serve the purpose of reducing power loss. Even when being driven at a high carrier frequency, the semiconductor module 100 having the low-inductance structure is capable of reducing the surge voltage. Thus, it is particularly advantageous to apply the wide bandgap semiconductor to the semiconductor module 100.

<Second Preferred Embodiment>

Figure 5:
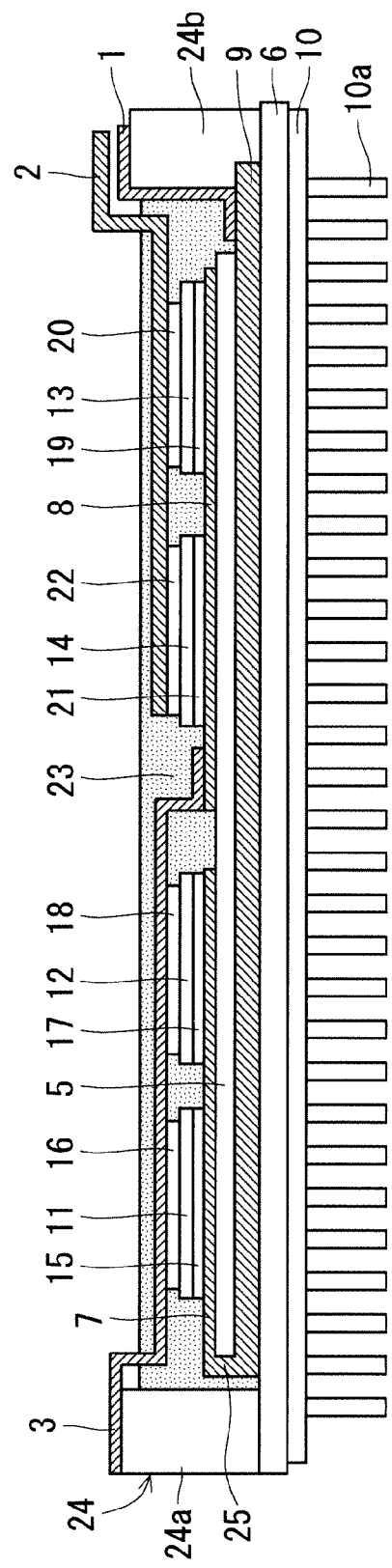
FIG. 5 is a cross-sectional view of a semiconductor module according to a second preferred embodiment.

FIG. 5 is a cross-sectional view of a semiconductor module 200 according to a second preferred embodiment. The semiconductor module 200 according to the second preferred embodiment has the configuration in which the metal member 4 included in the semiconductor module 100 is eliminated and the second metal pattern 9 and the third metal pattern 7 are integrally bonded through a junction 25. The configuration except for the above is the same as that of the first preferred embodiment, and a description thereof is omitted.

The second metal pattern 9 and the third metal pattern 7, which are bonded together on the outer side of the periphery of the first ceramic substrate 5 in FIG. 5, may be bonded together via a through-hole in the first ceramic substrate 5.

<Effects>

The semiconductor module 200 according to the second preferred embodiment further includes the third metal pattern 7 formed on the first main surface of the insulating substrate (the first ceramic substrate 5) separately from the first metal pattern 8. The lower surface electrode of the second semiconductor element 11 is bonded to the third metal pattern 7. The third metal pattern 7 and second metal pattern 9 are made of the same material. The third metal pattern 7 and the second metal pattern 9 are integrally bonded.

Thus, the second preferred embodiment eliminates the metal member 4 included in the first preferred embodiment.

This configuration can further reduce the number of components of the semiconductor module 200.

<Third Preferred Embodiment>

Figure 6:
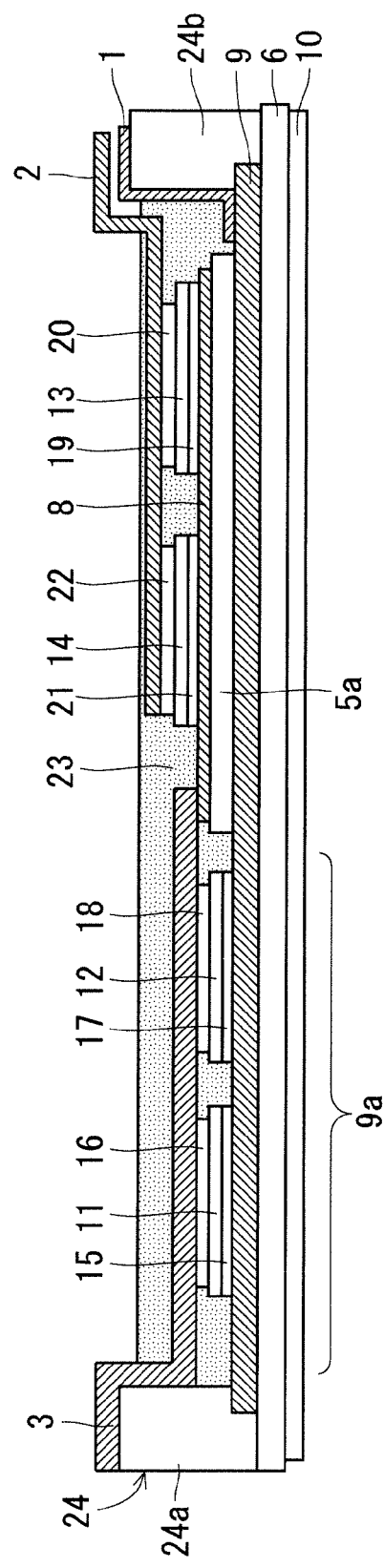
FIG. 6 is a cross-sectional view of a semiconductor module according to a third preferred embodiment.

FIG. 6 is a cross-sectional view of a semiconductor module 300 according to a third preferred embodiment. In the semiconductor module 100, the lower surface electrode of the second semiconductor element 11 and the lower surface electrode of the second freewheeling diode 12 are bonded to the third metal pattern 7. Meanwhile, in the semiconductor module 300 according to the third preferred embodiment, which eliminates the third metal pattern 7, the lower surface electrode of the second semiconductor element 11 and the lower surface electrode of the second freewheeling diode 12 are bonded to the second metal pattern 9.

As shown in FIG. 6, in the third preferred embodiment, the second metal pattern 9 includes an extending region 9a that does not overlap the insulating substrate (a first ceramic substrate 5a) in plan view. The lower surface electrode of the second semiconductor element 11 is bonded to the extending region 9a of the second metal pattern 9 through the solder 15. The configuration except for the above is the same as that of the first preferred embodiment, and a description thereof is omitted.

<Effects>

In the semiconductor module 300 according to the third preferred embodiment, the second metal patter 9 includes the extending region 9a that does not overlap the insulating substrate (the first ceramic substrate 5a) in plan view. The lower surface electrode of the second semiconductor element 11 is bonded to the extending region 9a of the second metal pattern 9.

The third preferred embodiment includes the first ceramic substrate 5a obtained by downsizing the first ceramic substrate 5 included in the first preferred embodiment and eliminates the third metal pattern 7 that has been originally formed in the region devoid of the first ceramic substrate 5 due to the downsizing. This configuration reduces the region in which two substrates being the first and second ceramic substrates 5a and 6 overlap each other, translating into the improvement of thermal resistance. In addition, this configuration reduces the number of components of the semiconductor module 300.

In the third preferred embodiment, inductance can be reduced although the coupling region for coupling the P electrode and the N electrode decreases. The semiconductor module 300 according to the third preferred embodiment is capable of achieving low inductance and low thermal resistance and is therefore particularly effective when being applied to, for example, a step-up converter having a higher carrier frequency in which the lower arm works in severer conditions.

In the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module comprising:
   a first semiconductor element and a second semiconductor element connected in series;
   an insulating substrate;
   a first metal pattern formed on a first main surface of said insulating substrate;
   a second metal pattern formed on a second main surface side of said insulating substrate;
   a first electrode plate;
   a second electrode plate; and
   a third electrode plate, wherein
   said first and second semiconductor elements each include an upper surface electrode and a lower surface electrode,
   said lower surface electrode of said first semiconductor element is bonded to said first metal pattern,
   said upper surface electrode of said first semiconductor element is bonded to said first electrode plate,
   said first metal pattern and said third electrode plate are bonded to each other,
   said upper surface electrode of said second semiconductor element is bonded to said third electrode plate,
   said lower surface electrode of said second semiconductor element is electrically connected to said second metal pattern,
   said second metal pattern and said second electrode plate are bonded to each other, and
   one end of said first electrode plate and one end of said second electrode plate are led out on the same side.

2. The semiconductor module according to claim 1, further comprising a third metal pattern formed on the first main surface of said insulating substrate separately from said first metal pattern, wherein
   said lower surface electrode of said second semiconductor element is bonded to said third metal pattern, and
   said third metal pattern and said second metal pattern are electrically connected to each other.

3. The semiconductor module according to claim 1, further comprising a third metal pattern formed on the first main surface of said insulating substrate separately from said first metal pattern, wherein
   said lower surface electrode of said second semiconductor element is bonded to said third metal pattern,
   said third metal pattern and said second metal pattern are made of the same material, and
   said third metal pattern and said second metal pattern are integrally bonded.

4. The semiconductor module according to claim 1, wherein
   said second metal pattern includes an extending region that does not overlap said insulating substrate in plan view; and
   said lower surface electrode of said second semiconductor element is bonded to said extending region of said second metal pattern.

5. The semiconductor module according to claim 1, further comprising:
   a first freewheeling diode connected in parallel with said first semiconductor element serving as a switching element; and
   a second freewheeling diode connected in parallel with said second semiconductor element serving as a switching element, wherein
   said first and second freewheeling diodes each include an upper surface electrode and a lower surface electrode,
   said lower surface electrode of said first freewheeling diode is bonded to said first metal pattern, said upper surface electrode of said first freewheeling diode is bonded to said first electrode plate, said upper surface electrode of said second freewheeling diode is bonded to said third electrode plate, and said lower surface electrode of said second freewheeling diode is electrically connected to said second metal pattern.

6. A semiconductor device comprising:

a plurality of said semiconductor modules according to claim 1; and a case, wherein said plurality of semiconductor modules are connected in parallel and housed in said case.

7. The semiconductor module according to claim 1, further comprising a heat sink held below a surface of said second metal pattern opposite to said insulating substrate with an insulating material located therebetween.

8. The semiconductor module according to claim 1, wherein said first and second semiconductor elements comprise wide bandgap semiconductor elements.

* * * * *